United States Patent
Belhachemi

(10) Patent No.: US 11,501,997 B2
(45) Date of Patent: Nov. 15, 2022

(54) PROCESS FOR TRANSFERRING A LAYER

(71) Applicant: Soitec, Bernin (FR)

(72) Inventor: Djamel Belhachemi, Saint Martin d'heres (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/042,019

(22) PCT Filed: Mar. 27, 2019

(86) PCT No.: PCT/IB2019/000206
§ 371 (c)(1),
(2) Date: Sep. 25, 2020

(87) PCT Pub. No.: WO2019/186267
PCT Pub. Date: Oct. 3, 2019

(65) Prior Publication Data
US 2021/0166968 A1    Jun. 3, 2021

(30) Foreign Application Priority Data
Mar. 29, 2018   (FR) ...................................... 1800257

(51) Int. Cl.
*H01L 21/762*   (2006.01)

(52) U.S. Cl.
CPC .. *H01L 21/76254* (2013.01); *H01L 21/76256* (2013.01)

(58) Field of Classification Search
CPC ......... H01L 21/76254; H01L 21/76256; H01L 21/2007; H01L 21/6385; H01L 2224/83894
See application file for complete search history.

(56) References Cited

U.S. PATENT DOCUMENTS 8,679,946 B2    3/2014   Moriceau et al.
9,257,339 B2 *  2/2016   Henley ................... C30B 29/06
(Continued)

FOREIGN PATENT DOCUMENTS

FR     2940852 A1    7/2010
WO     02/37556 A1   3/2002

OTHER PUBLICATIONS

International Search Report for International Application No. PCT/IB2019/000206 dated May 27, 2019, 2 pages.
(Continued)

*Primary Examiner* — Latanya N Crawford Eason
(74) *Attorney, Agent, or Firm* — TraskBritt

(57) ABSTRACT

A layer transfer process comprises depositing a first, temporary bonding layer of SOG comprising methylsiloxane by spin coating on a surface comprising substantially no silicon of an initial substrate, and applying a first heat treatment for densifying the first, temporary bonding layer. An intermediate substrate is joined to the initial substrate, and then thinned A second bonding layer of SOG comprising silicate or methylsilsesquioxane is deposited by spin coating on a surface of the thinned initial substrate and/or a final substrate, and a second heat treatment is applied for densifying the second bonding layer. The thinned initial substrate and the final substrate and then joined, and the intermediate substrate is detached thereafter. The process may be carried out at temperatures below 300° C. to avoid damaging components that may be present in the substrates.

13 Claims, 2 Drawing Sheets

(56) References Cited

U.S. PATENT DOCUMENTS

| | | | |
|---|---|---|---|
| 10,826,459 B2* | 11/2020 | Castex | H03H 9/02574 |
| 2016/0372628 A1* | 12/2016 | Henley | H01L 21/7813 |
| 2017/0079144 A1* | 3/2017 | Coleman | H05K 3/4644 |
| 2019/0119531 A1* | 4/2019 | Kim | H01L 21/6836 |
| 2019/0127608 A1* | 5/2019 | Kim | C09J 5/00 |

OTHER PUBLICATIONS

International Written Opinion for International Application No. PCT/IB2019/000206 dated May 27, 2019, 6 pages.
Yamada et al., Methylsiloxane Spin-on-Glass Films for Low Dielectric Constant Interlayer Dielectrics, Journal of the Electrochemical Society, vol. 147, No. 4, (2000), pp. 1477-1480.
Singapore Written Opinion for Singapore Application No. 11202009447X dated Nov. 19, 2021, 5 pages.

* cited by examiner

PROCESS FOR TRANSFERRING A LAYER

CROSS-REFERENCE TO RELATED APPLICATIONS

This application is a national phase entry under 35 U.S.C. § 371 of International Patent Application PCT/IB2019/000206, filed Mar. 27, 2019, designating the United States of America and published in French as International Patent Publication WO 2019/186267 A1 on Oct. 3, 2019, which claims the benefit under Article 8 of the Patent Cooperation Treaty to French Patent Application Serial No. 1800257, filed Mar. 29, 2018.

TECHNICAL FIELD

The present disclosure relates to a process for transferring a layer.

BACKGROUND

Processes are known for transferring layers, which comprise a step of providing an initial substrate, a step of providing an intermediate substrate, a first step of joining the intermediate substrate and the initial substrate, a step of thinning the initial substrate after having been joined to the intermediate substrate, a step of providing a final substrate, a second step of joining the thinned initial substrate and the final substrate, and a step of detaching the intermediate substrate after the second joining step. Such a process is described, for example, in International Patent Publication No. WO 0237556.

However, there remains a need for 3D integration applications for wafers comprising, for example, components, given that this type of process must not exceed a certain thermal budget so as not to damage the components, in particular, the presence of metal lines in the initial substrate and/or in the final substrate does not allow maximum temperatures of 300° C. to be exceeded.

BRIEF SUMMARY

The present disclosure overcomes these limitations of the prior art by providing a layer transfer process that is implemented at low temperatures below 300° C., or even less. In this way, it is possible to solve the problems that are currently encountered.

The present disclosure relates to a layer transfer process comprising a step of providing an initial substrate; a step of providing an intermediate substrate; a first step of joining the intermediate substrate and the initial substrate; a step of thinning the initial substrate after having been joined to the intermediate substrate; a step of providing a final substrate; a second step of joining the thinned initial substrate and the final substrate; a step of detaching the intermediate substrate after the second joining step, wherein the intermediate substrate comprises silicon on the surface that is intended to be joined to the initial substrate; the initial substrate comprises substantially no silicon on the surface that is intended to be joined to the intermediate substrate; depositing a first bonding layer, referred to as a "temporary" bonding layer, of SOG-type comprising methylsiloxane in the liquid state by spin coating carried out on the surface of the initial substrate, which comprises substantially no silicon, followed by a first heat treatment for densifying this first, temporary, bonding layer before the first joining step; the second joining step is carried out via a second bonding layer of SOG-type comprising silicate or methylsilsesquioxane in the liquid state and deposited by spin coating followed by a second densifying heat treatment; and wherein the final substrate is designed such that it would deteriorate on application of a heat treatment exceeding 300° C.

In advantageous embodiments, the initial substrate comprises components designed such that they would deteriorate on application of a heat treatment exceeding 300° C.

In advantageous embodiments, the first and/or the second densifying heat treatment is carried out at a temperature of less than 300° C., preferably less than 200° C., or more preferably less than 100° C.

In advantageous embodiments, the first and/or the second joining step is carried out by direct bonding by molecular adhesion.

In advantageous embodiments, the initial substrate is chosen from the group of lithium niobate and lithium tantalate.

In advantageous embodiments, the initial substrate is chosen from among the group consisting of GaAs, InP and Ge.

In advantageous embodiments, the intermediate substrate is silicon.

In advantageous embodiments, the final substrate is silicon comprising components designed such that they would deteriorate on application of a heat treatment exceeding 300° C.

In advantageous embodiments, the final substrate is a flexible plastic.

In advantageous embodiments, the detaching step is carried out by a heat treatment at a temperature of less than 300° C., more preferably less than 200° C., or more preferably less than 100° C.

BRIEF DESCRIPTION OF THE DRAWINGS

Other features and advantages of the disclosure will be better understood from reading the following detailed description with reference to the appended drawings in which.

To improve the readability of the figures, the various layers are not necessarily shown to scale.

DETAILED DESCRIPTION

Figure 1A:
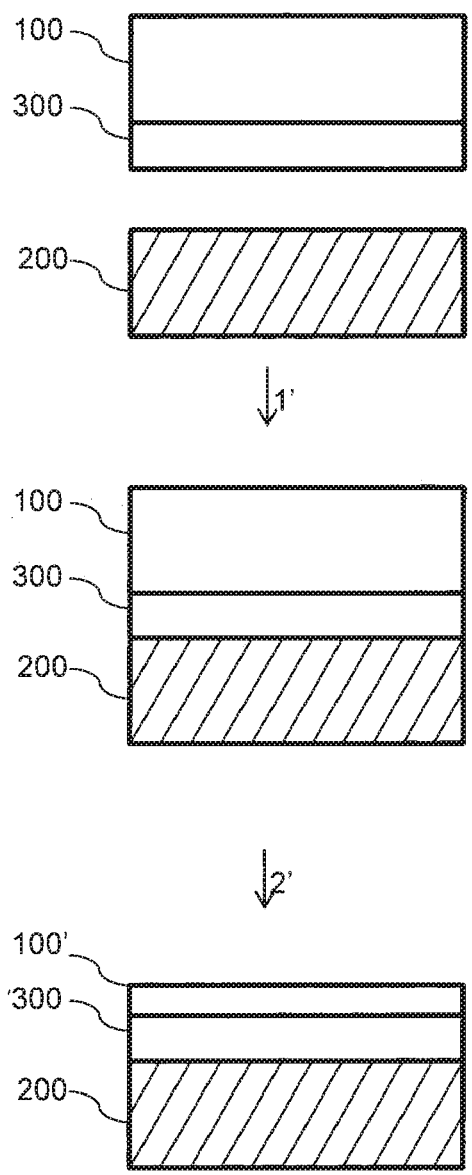
FIGS. 1A and 1B illustrate a layer transfer process according to one embodiment of the present disclosure.
Figure 1B:
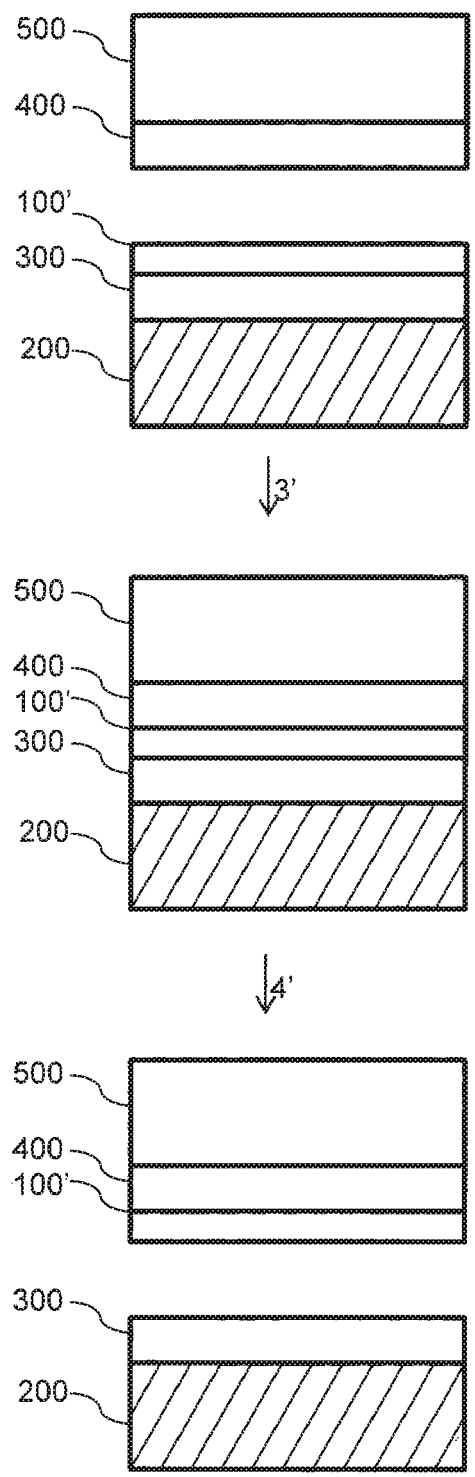

FIGS. 1A and 1B schematically illustrate the process for transferring a layer 100' obtained from an initial substrate 100 by means of a step of thinning 2' after having been joined, in a first joining step 1', to an intermediate substrate 200 via a first, temporary, bonding layer 300. This transfer process further comprises a second step of joining 3' the layer 100', after the thinning step 2', to a final substrate 500 via a second bonding layer 400 followed by a step of detaching at the interface present between the initial substrate 100 and the first, temporary, bonding layer 300.

The first, temporary, bonding layer 300 and the second bonding layer 400 are generally chosen from the family of SOGs (spin-on glasses), which exhibit the property of being in the liquid state at ambient temperature but may be densified, and solidified, by means of a suitable heat treatment.

This technique involves rotating the substrate on which the bonding layer (300, 400) is to be deposited at a substantially constant and relatively high speed in order to spread the layer in the liquid state uniformly over the entire surface of the substrate by centrifugal force. To this end, the substrate is typically placed and held by vacuum chuck on a turntable.

A person skilled in the art is capable of determining the operating conditions, such as the volume deposited on the surface of the substrate, the speed of rotation of the substrate, and the minimum deposition time according to the desired thickness for the adhesive layer.

The thicknesses of the first, temporary, bonding layer 300 and second bonding layer 400 are typically between 2 μm and 8 μm. Additionally, the spin coating technique used is advantageous in that the deposition of the bonding layer (300, 400) is carried out at ambient temperature, and is followed by a densifying anneal at quite a low temperature, which, therefore, does not cause the substrate on which the dielectric layer is formed to deform.

In one non-limiting example of the present disclosure, the first and/or the second densifying heat treatment is carried out at a temperature of less than 300° C., preferably less than 200° C., or more preferably less than 100° C.

The detaching step is carried out by a heat treatment at a temperature of less than 300° C., more preferably less than 200° C., or more preferably less than 100° C.

The first, temporary, bonding layer 300 is chosen from families of SOGs of "methylsiloxane" type, sold, for example, under the references "LSFxx" by FILMTRONICS.

The second bonding layer 400 is chosen from families of SOGs of "silicate" or "methylsilsesquioxane" type, sold, for example, under the references "20B" or "400F" by FILMTRONIX or "FOX16" by DOW CORNING.

According to the disclosure, the initial substrate 100 comprises substantially no silicon on the surface that is intended to be joined to the intermediate substrate 200, and the intermediate substrate 200 comprises silicon on the surface that is intended to be joined to the initial substrate 100.

The presence or absence of silicon on the surface thus makes it possible to influence and adjust the bonding interface energy of the interfaces that are present between the initial substrate 100 and the first, temporary, bonding layer 300 and between the first, temporary, bonding layer 300 and the intermediate substrate 200. The presence or absence of silicon and thus of "silanol"-type molecular bonds on the surface determines these bonding interface energies because the first, temporary, bonding layer 300 has a composition after densification such that bonds form via assimilation of the "silanol"-type molecular bonds.

According to one non-limiting example of the present disclosure, the initial substrate 100 is chosen from among the group consisting of lithium niobate and lithium tantalate.

According to one non-limiting example of the present disclosure, the initial substrate 100 is chosen from among the group consisting of GaAs, InP and Ge.

According to one non-limiting example of the present disclosure, the intermediate substrate 200 is silicon.

According to one non-limiting example of the present disclosure, the intermediate substrate 200 is glass.

According to one non-limiting example of the present disclosure, the intermediate substrate 200 is any substrate other than silicon but covered on the surface with a layer of polycrystalline silicon.

The initial substrate 100 on which the first, temporary, bonding layer 300 has been deposited and densified is joined to the intermediate substrate in the first joining step 1'.

After the step of thinning 2' the initial substrate 100, the second bonding layer 400 is deposited and densified either on the final substrate 500 or on the layer of the thinned initial substrate 100', or on both, in the second joining step 3' (FIG. 1B).

The first and/or the second joining step (1', 3') are preferably carried out by direct bonding by molecular adhesion. The bonding is preferably carried out at ambient temperature, namely about 20° C. It is, however, possible to carry out the bonding at a temperature of between 20° C. and 50° C., and more preferably between 20° C. and 30° C.

Additionally, the bonding step is advantageously carried out at low pressure, i.e., at a pressure lower than or equal to 5 mTorr, which makes it possible to desorb the water from the surfaces forming the bonding interface, i.e., the surface of the electrically insulating first, temporary, bonding layer 300 and the surface of the initial substrate 100. Carrying out the bonding step under vacuum makes it possible to further improve the desorption of water at the bonding interface.

A heat treatment in order to strengthen the bonding interface may be carried out at low temperatures of up to 300° C. without the entire assembly undergoing overly substantial deformations leading to the materials breaking or detachment at the bonding interface.

The fact that the first, temporary, bonding layer 300 according to the present disclosure is chosen from families of SOGs of "methylsiloxane" type, and the fact that the initial substrate 100 comprises substantially no silicon on the surface that is intended to be joined to the intermediate substrate 200, and the fact that the intermediate substrate 200 comprises silicon on the surface that is intended to be joined to the initial substrate 100, lead to the interface between the initial substrate 100 and the first, temporary, bonding layer 300 being weaker in terms of bonding interface energy than the interface between the first, temporary, bonding layer 300 and the intermediate substrate 200.

These bonding interface energies obtained by the direct bonding between the surface of the initial substrate 100 to the intermediate substrate 200 via the first, temporary, bonding layer 300 of the present disclosure are high and allow the step of thinning the initial substrate 100 by chemical-mechanical polishing (CMP).

These bonding interface energies obtained are so high that the process according to the present disclosure allows the step of thinning 2' the initial substrate 100 by chemical-mechanical polishing (CMP) even in the case where a substantial difference in thermal expansion coefficient between the initial substrate 100 and the intermediate substrate 200 is present, which is the case for an initial substrate 100 of lithium niobate or lithium tantalate and an intermediate substrate 200 of silicon.

The second joining step 3' takes place via a second bonding layer 400 of the SOG-type comprising silicate or methylsilsesquioxane in the liquid state and deposited by spin coating followed by a second densifying heat treatment, and in which the final substrate is designed such that it would deteriorate on application of a heat treatment exceeding 300° C. It should be noted that the bonding interface energies obtained by the direct bonding between the surface of the thinned initial substrate 100' to the final substrate 500 via the second bonding layer 400 of the present disclosure are higher than the bonding interface energies obtained by the direct bonding between the surface of the initial substrate 100 to the intermediate substrate 200 via the first, temporary, bonding layer 300 of the present disclosure.

The detaching step 4' is carried out by a heat treatment at a temperature of less than 300° C., more preferably less than 200° C., or more preferably less than 100° C.

Thus, the detaching step 4' makes it possible to detach at the interface between the initial substrate 100 and the first, temporary, bonding layer 300. This interface corresponds to the initially prepared surface of the initial substrate 100 for the deposition of the first, temporary, bonding layer 300. The detachment frees this surface, and thus the components that are potentially present in the initial substrate 100, and thus allows a co-integration of components that is straightforward and ready to be accessed easily after having transferred the thinned layer of the initial substrate 100'.

In addition to applying a thermal stress such as described above, a mechanical stress, for example, by inserting a blade at the wafer edge, may be applied instead.

According to one non-limiting example of the present disclosure, the final substrate 500 is silicon comprising components designed such that they would deteriorate on application of a heat treatment exceeding 300° C.

According to another non-limiting embodiment, the final substrate 500 may be silicon material further comprising a trapping layer toward the interface to be joined with the thinned layer 100' of the initial substrate 100, making it possible to trap electric-charge carriers caused by the frequency operation of radiofrequency components. This layer thus makes it possible to decrease insertion losses and improve the performance of the devices.

According to one non-limiting example of the present disclosure, the final substrate 500 is a flexible plastic. Together with a thinned layer of initial substrate 100' made of piezoelectric material, this allows any application comprising components for "wearable" applications.

Furthermore, it should be noted that the size of the final substrate 500 is not limited and multiple transfers of different initial substrates 100 to one and the same final substrate are possible.

The invention claimed is:

1. A layer transfer process, comprising:
providing an initial substrate;
providing an intermediate substrate, wherein the intermediate substrate comprises silicon on a surface to be joined to the initial substrate and the initial substrate comprises substantially no silicon on a surface to be joined to the intermediate substrate;
depositing a first, temporary bonding layer of spin-on-glass (SOG) comprising methylsiloxane in a liquid state by spin coating on the surface of the initial substrate comprising substantially no silicon;
applying a first heat treatment for densifying the first, temporary bonding layer;
after densifying the first, temporary bonding layer, joining the intermediate substrate and the initial substrate;
thinning the initial substrate after joining the initial substrate to the intermediate substrate;
providing a final substrate configured to deteriorate on application of a heat treatment exceeding 300° C.;
depositing a second bonding layer of SOG comprising silicate or methylsilsesquioxane in a liquid state by spin coating on a surface of the thinned initial substrate and/or the final substrate;
applying a second heat treatment for densifying the second bonding layer;
after densifying the second bonding layer, joining the thinned initial substrate and the final substrate; and
detaching the intermediate substrate after the joining the thinned initial substrate and the final substrate, wherein the detachment of the intermediate substrate after the joining of the thinned initial substrate and the final substrate is carried out by a heat treatment at a temperature of less than 300° C.

2. The process of claim 1, wherein the initial substrate comprises components configured to deteriorate on application of a heat treatment exceeding 300° C.

3. The process of claim 2, wherein at least one of the first heat treatment and the second heat treatment is carried out at a temperature of less than 300° C.

4. The process of claim 3, wherein the at least one of the first heat treatment and the second heat treatment is carried out at a temperature of less than 200° C.

5. The process of claim 4, wherein the at least one of the first heat treatment and the second heat treatment is carried out at a temperature of less than 100° C.

6. The process of claim 1, wherein at least one of joining the intermediate substrate and the initial substrate and joining the thinned initial substrate and the final substrate is carried out by direct bonding by molecular adhesion.

7. The process of claim 1, wherein the initial substrate comprises a material chosen from among the group consisting of lithium niobate and lithium tantalate.

8. The process of claim 1, wherein the initial substrate comprises a material chosen from among the group consisting of GaAs, InP and Ge.

9. The process of claim 1, wherein the intermediate substrate comprises silicon.

10. The process of claim 1, wherein the final substrate comprises silicon and includes components configured to deteriorate on application of a heat treatment exceeding 300° C.

11. The process of claim 1, wherein the final substrate comprises a flexible plastic material.

12. The process of claim 1, wherein the detachment of the intermediate substrate after the joining of the thinned initial substrate and the final substrate is carried out by a heat treatment at a temperature of less than 200° C.

13. The process of claim 2, wherein the detachment of the intermediate substrate after the joining of the thinned initial substrate and the final substrate is carried out by a heat treatment at a temperature of less than 100° C.

* * * * *